(12) United States Patent
Yuan

(10) Patent No.: US 7,373,630 B1
(45) Date of Patent: May 13, 2008

(54) METHODS FOR IMPROVED STRUCTURED ASIC DESIGN

(75) Inventor: Jinyong Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 204 days.

(21) Appl. No.: 11/301,604

(22) Filed: Dec. 12, 2005

(51) Int. Cl.
*G06F 17/50* (2006.01)
*H03K 19/00* (2006.01)

(52) U.S. Cl. .............................. 716/17; 716/16; 716/2; 716/3

(58) Field of Classification Search ............... 716/2, 716/3, 16, 17
See application file for complete search history.

(56) References Cited

U.S. PATENT DOCUMENTS

| | | | |
|---|---|---|---|
| 5,526,278 A * | 6/1996 | Powell | ........................ 716/16 |
| 5,815,405 A * | 9/1998 | Baxter | ........................... 716/3 |
| 5,825,202 A | 10/1998 | Tavana et al. | |
| 5,874,834 A | 2/1999 | New | |
| 6,091,262 A | 7/2000 | New | |
| 6,094,065 A | 7/2000 | Tavana et al. | |
| 6,242,945 B1 | 6/2001 | New | |
| 6,360,352 B2 * | 3/2002 | Wallace | ........................ 716/2 |
| 6,490,707 B1 | 12/2002 | Baxter | |
| 6,515,509 B1 | 2/2003 | Baxter | |
| 6,526,563 B1 | 2/2003 | Baxter | |
| 2004/0073882 A1 * | 4/2004 | Osann | ........................ 716/16 |
| 2004/0111691 A1 | 6/2004 | Tan et al. | |
| 2004/0261052 A1 | 12/2004 | Perry et al. | |
| 2005/0285622 A1 * | 12/2005 | Gliese | ........................ 326/37 |
| 2006/0001444 A1 | 1/2006 | Chua et al. | |

OTHER PUBLICATIONS

"LCELL WYSIWYG Description for the Stratix II Family", Version 1.1, Altera Corporation, Mar. 22, 2004.

* cited by examiner

*Primary Examiner*—Stacy Whitmore
*Assistant Examiner*—Magid Y. Dimyan
(74) *Attorney, Agent, or Firm*—Ropes & Gray LLP; Robert R. Jackson

(57) ABSTRACT

In the design of a structured ASIC device that is intended to be functionally equivalent to a programmed FPGA, an initial design for the structured ASIC may be modified in any of several ways to improve various aspects of its performance. For example, for critical or near-critical parts of the structured ASIC design, attempts may be made to permute inputs to improve performance. Alternatively or in addition, Shannon's decomposition or other decomposition may be attempted to move a critical input closer to the output of a cell. Another possible modification is replacement of high-speed adders with slower-speed adders in non-critical parts of the structured ASIC design.

20 Claims, 15 Drawing Sheets

METHODS FOR IMPROVED STRUCTURED ASIC DESIGN

BACKGROUND OF THE INVENTION

This invention relates to the design of application-specific integrated circuits ("ASICs"). More particularly, the invention relates to the design of ASICs of the type known as structured ASICs that are intended to be functionally equivalent to a field-programmable gate array ("FPGA") that has been programmed in a particular way.

FPGAs are relatively general-purpose integrated circuit devices that can be programmed to perform any of many different functions such as logic. After a design has been implemented and proven in an FPGA, it may be desirable to migrate that design to a structured ASIC. A structured ASIC is an integrated circuit that always has the same basic structure, but that has several layers that can be customized to cause the structured ASIC to implement particular functions. For example, many of the masks used to make a particular type of structured ASIC are the same or substantially the same for all ASIC products of that type. A few of the masks can be customized to give any one of those products a particular set of functions. These functions can be those that have been proven to work in a programmed FPGA. Using a structured ASIC to replicate an FPGA in this way (as opposed to attempting to design an unstructured ASIC, completely "from scratch", for this purpose) has a number of advantages. These include faster design turn-around, lower design cost, less risk that the ASIC design will not be a good functional equivalent of the FPGA design, etc.

References such as the following show examples of structured ASICs and methods for converting FPGA designs to structured ASIC implementations of those designs: Foo U.S. patent application Ser. No. 10/861,585, filed Jun. 4, 2004; Chua et al. U.S. patent application Ser. No. 10/884,460, filed Jul. 2, 2004; Yuan et al. U.S. patent application Ser. No. 10/916,305, filed Aug. 11, 2004; Schleicher et al. U.S. patent application Ser. No. 11/050,607, filed Feb. 3, 2005; Pedersen et al. U.S. patent application Ser. No. 11/072,560, filed Mar. 3, 2005; Schleicher et al. U.S. patent application Ser. No. 11/097,633, filed Apr. 1, 2005; Yuan et al. U.S. patent application Ser. No. 11/101,949, filed Apr. 8, 2005; Park et al. U.S. patent application Ser. No. 11/108,370, filed Apr. 18, 2005; Park et al. U.S. patent application Ser. No. 11/115,641, filed Apr. 27, 2005; Lim et al. U.S. patent application Ser. No. 11/141,867, filed May 31, 2005; and Tan et al. U.S. patent application Ser. No. 11/141,941, filed May 31, 2005. (All of these references are assigned to the same assignee as this disclosure, and references identified as patent applications are co-pending with this disclosure.) As at least some of these references show, programmed-FPGA-to-structured-ASIC conversion methods frequently include use of libraries of structured ASIC cells that are known to be equivalent to particular programmed FPGA functions or cells.

There are several respects in which the known methods of converting an FPGA design to a functionally equivalent structured ASIC design could be improved. For example, the known methods do not attempt to permute the inputs to structured ASIC library cells to try to achieve better timing performance. Nor do the known methods attempt to decompose a structured ASIC library cell for similar purposes. Still another possible deficiency of known programmed-FPGA-to-structured-ASIC conversion methods is that the known methods tend to implement all adders in the structured ASIC using two-bit adder cells. These may be more costly (e.g., in terms of area occupied and power consumed) than is warranted in all cases.

SUMMARY OF THE INVENTION

In the design of a structured ASIC that is intended to be functionally equivalent to a programmed FPGA, after an initial design for the structured ASIC has been produced from a conversion of the programmed FPGA design, any one or more of several modifications of the initial structured ASIC design are attempted to improve various aspects of the structured ASIC design. One such possible modification is permutation of inputs to a cell in a critical portion of the structured ASIC design for the purpose of moving a critical logical input to that cell to a faster physical input of the cell. Another possible modification employs Shannon's decomposition to move a critical input to a cell to the selection control input terminal of a multiplexer that selects from among outputs of other cells that effect the remaining logical operations of the original structured ASIC cell. Still another possible modification is decomposition of the original structured ASIC cell in an effort to move a critical input closer to the output of a new cell structure that implements the decomposed version of the original. A final possible modification is replacement of high-speed, two-bit adders in non-critical portions of the structured ASIC design with slower-speed, one-bit adders.

Further features of the invention, its nature and various advantages, will be more apparent from the accompanying drawings and the following detailed description.

DETAILED DESCRIPTION

This description assumes a basic knowledge of programmed-FPGA-to-structured-ASIC conversion of the general type shown in the references mentioned earlier in this specification.

Figure 1:
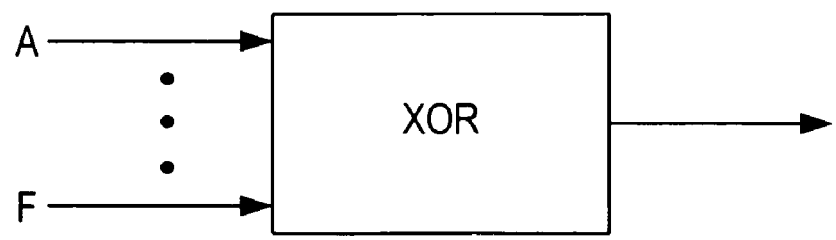
FIG. 1 is a simplified block diagram of an illustrative logic cell.

Unlike look-up-table-based ("LUT-based") architectures, the cells used in structured ASICs in accordance with this invention at least originate from a fixed library of functionally equivalent structured ASIC cells that have been worked out in advance. Not all k-input functions are legal library cells when k becomes larger than a certain number such as 4. The router step in known structured ASIC design methods does not permute the inputs of a cell retrieved from the library to attempt to speed up a critical path in the structured ASIC design. This can mean that significant structured ASIC performance improvements are not attained due to not taking advantage of faster structured ASIC cell inputs. Different structured ASIC cell inputs can have very different delays to output. For example, in the library of structured ASIC cells for the so-called Fusion product of Altera Corporation, a six-input EXCLUSIVE OR ("XOR") function (shown in block diagram form in FIG. 1) has a typical delay of 667 ps (picoseconds) from its F input to the output, but only a 154 ps delay from its A input to the output. This is a difference of over 500 ps.

Figure 2A:
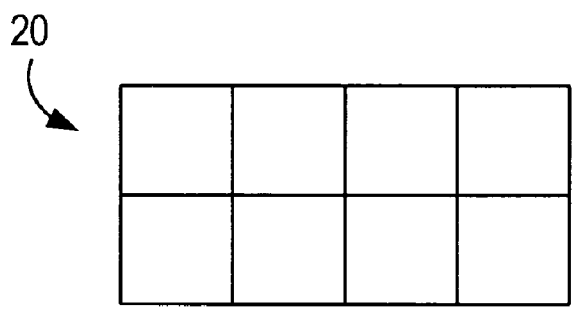
FIG. 2a is a simplified block diagram of illustrative circuitry in a structured ASIC device.

Another characteristic of known programmed-FPGA-to-structured-ASIC conversion methods is the following. In the interest of achieving balanced and speed-based flows, high-speed adders are always used to implement carry chains. However, high-speed adders cost much more than normal single-bit adder cells (see FIGS. 2a and 2b which show the relative sizes in a structured ASIC of a high-speed two-bit adder 20 and a normal one-bit adder 30.)

Figure 3:
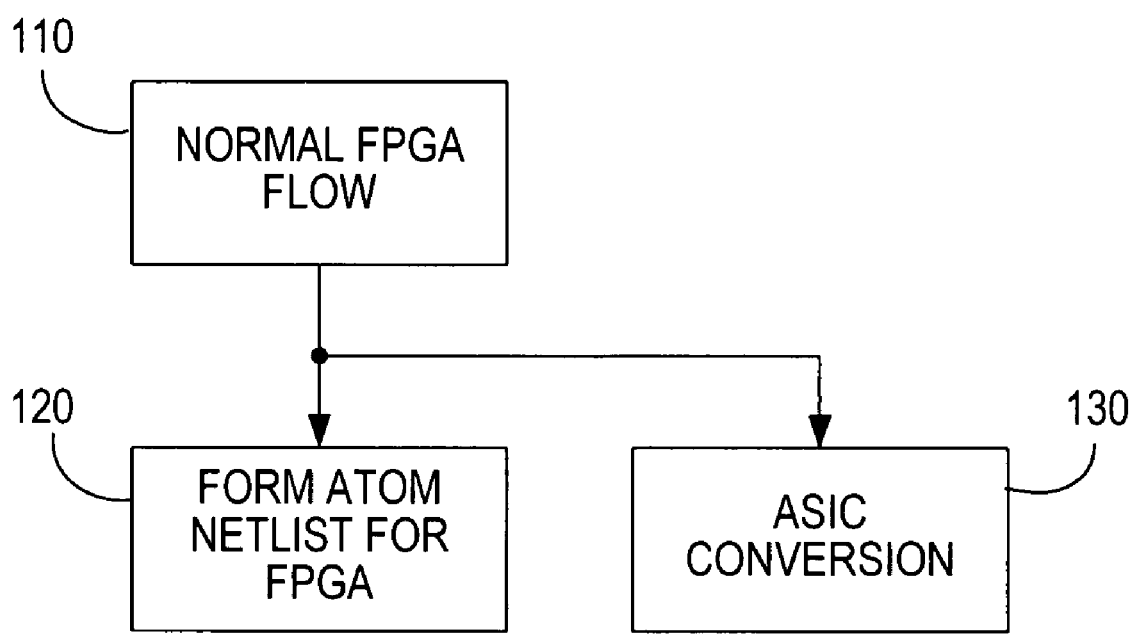
FIG. 3 is a simplified flow chart of part of an illustrative structured ASIC design process.
Figure 4A:
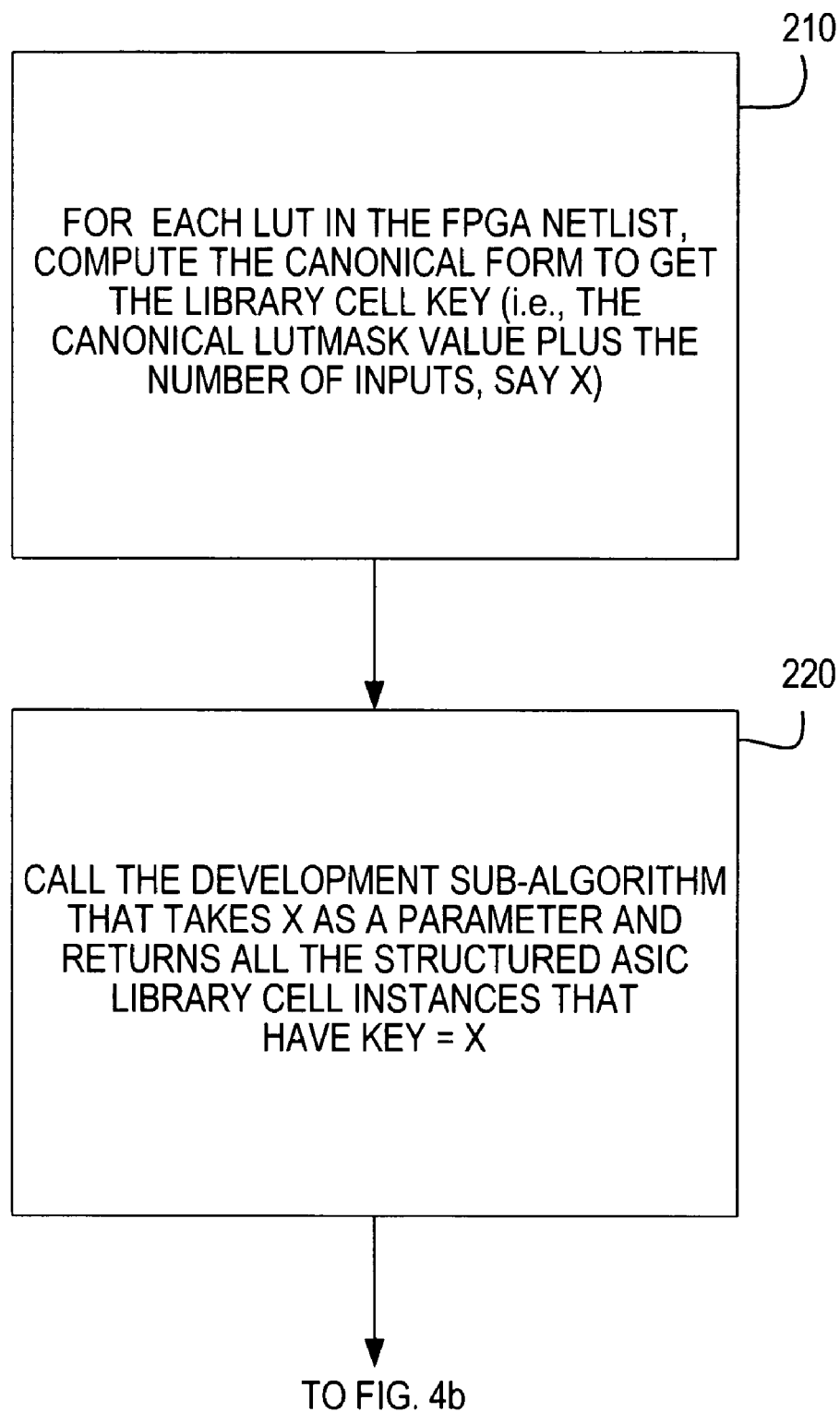
FIGS. 4a and 4b are collectively a simplified flow chart of further parts of an illustrative structured ASIC design process.
Figure 4B:
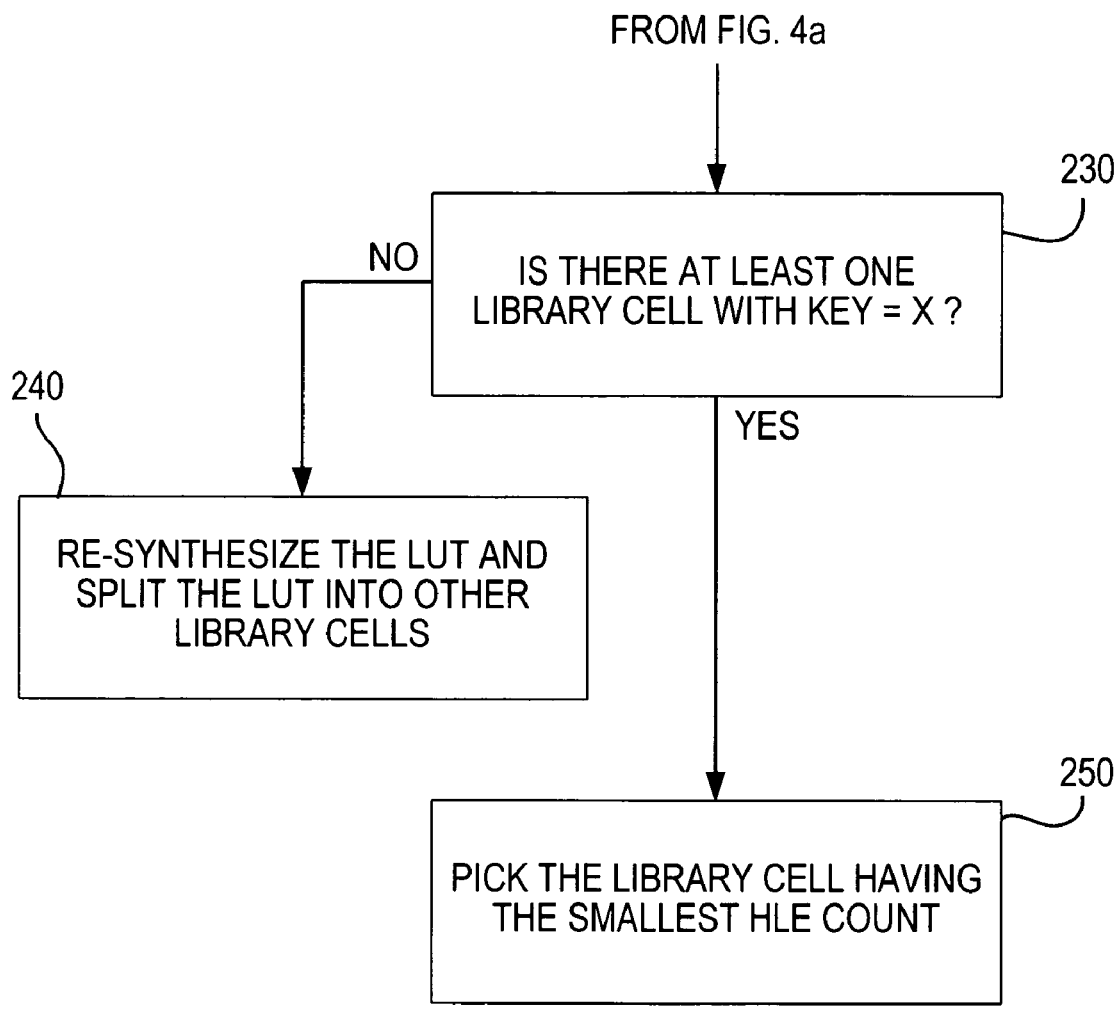

A typical algorithm for synthesizing a structured ASIC that is functionally equivalent to a programmed FPGA is shown in FIG. 3. The desired design (sometimes referred to herein as the user's logic design) goes through a normal FPGA synthesis flow 110. Just before the atom netlist 120 is formed, ASIC conversion step 130 is performed. This approach has the advantage of minimal disturbance to the structure of the FPGA netlist, since conversion from FPGA cells to structured ASIC cells is a local change. More detail regarding relevant aspects of ASIC conversion step 130 is shown in FIGS. 4a and 4b, which will now be described.

In step 210 each look-up table ("LUT") from step 110 is considered in turn. For a LUT being considered, the canonical form of the LUT is computed to get a library cell key value. This includes combining the minimum LUTMASK value and the number of inputs that the LUT has. The LUTMASK value of a LUT is the value stored in the memory of the LUT. The inputs to the LUT control selection of one of these memory storage locations as the source of the output of the LUT. The inputs to the LUT can be permuted until the LUTMASK value has been minimized, which is the so-called canonical LUTMASK value. That value is combined with the number of LUT inputs being used to produce the library cell key value that is referred to as X.

In step 220 X is used to find structured ASIC library cells that have key value X.

Step 230 tests whether any structured ASIC library cells having key value X have been found. If not, step 240 is performed to split the starting LUT into smaller LUTs, for each of which the above-described FIG. 4a/b steps are repeated. Eventually at least one structured ASIC library cell can be found for each starting or sub-divided LUT (e.g., because there is at least one structured ASIC library cell for every four-input LUT).

An affirmative result from step 230 leads to step 250. In step 250 the structured ASIC library cell having key value X and the smallest size is the one finally selected for use in the structured ASIC implementation of the user's logic design. (Step 250 refers to the smallest hybrid logic element ("HLE") count. An HLE is the basic unit of structured ASIC logic in this illustrative embodiment. An HLE is a via-programmable 2:1 multiplexer, two two-input NAND gates, and two inverters.)

Figure 5A:
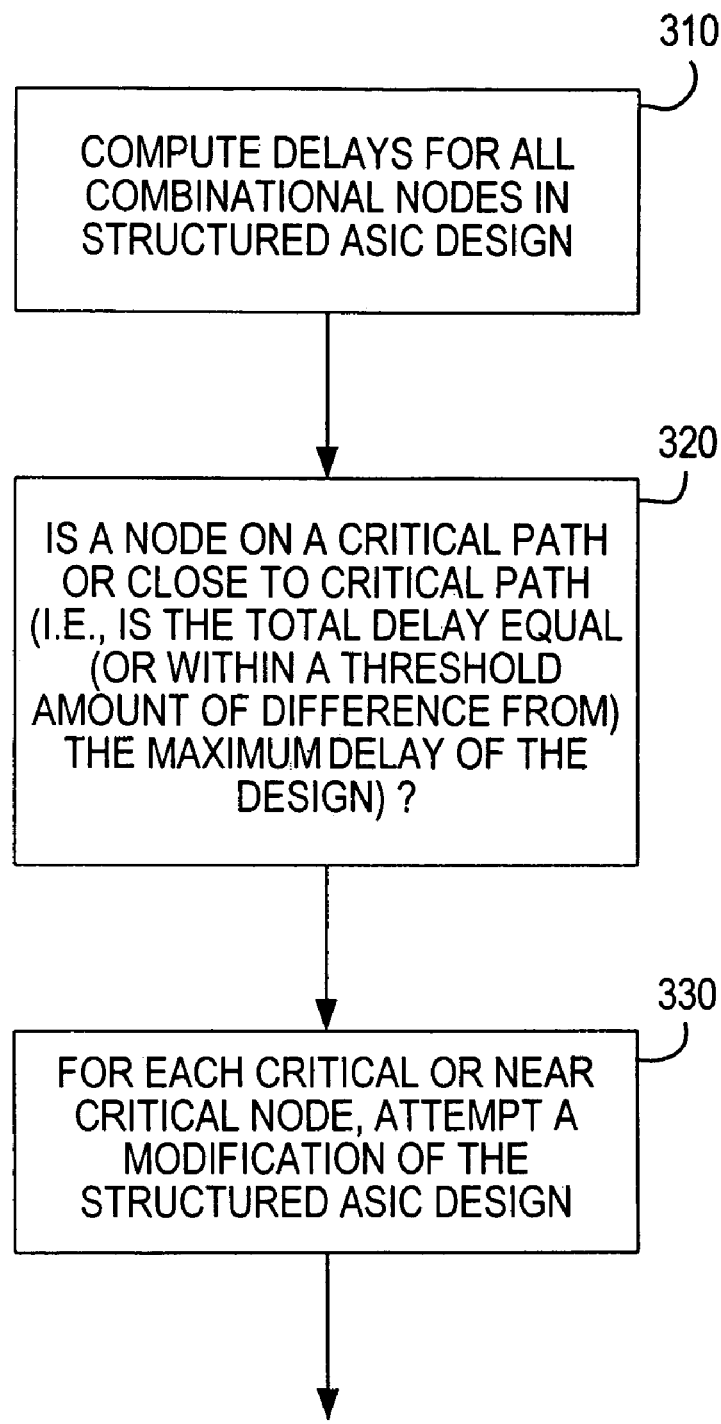
FIGS. 5a and 5b are collectively a simplified flow chart of other aspects of an illustrative structured ASIC design process in accordance with the invention.
Figure 5B:
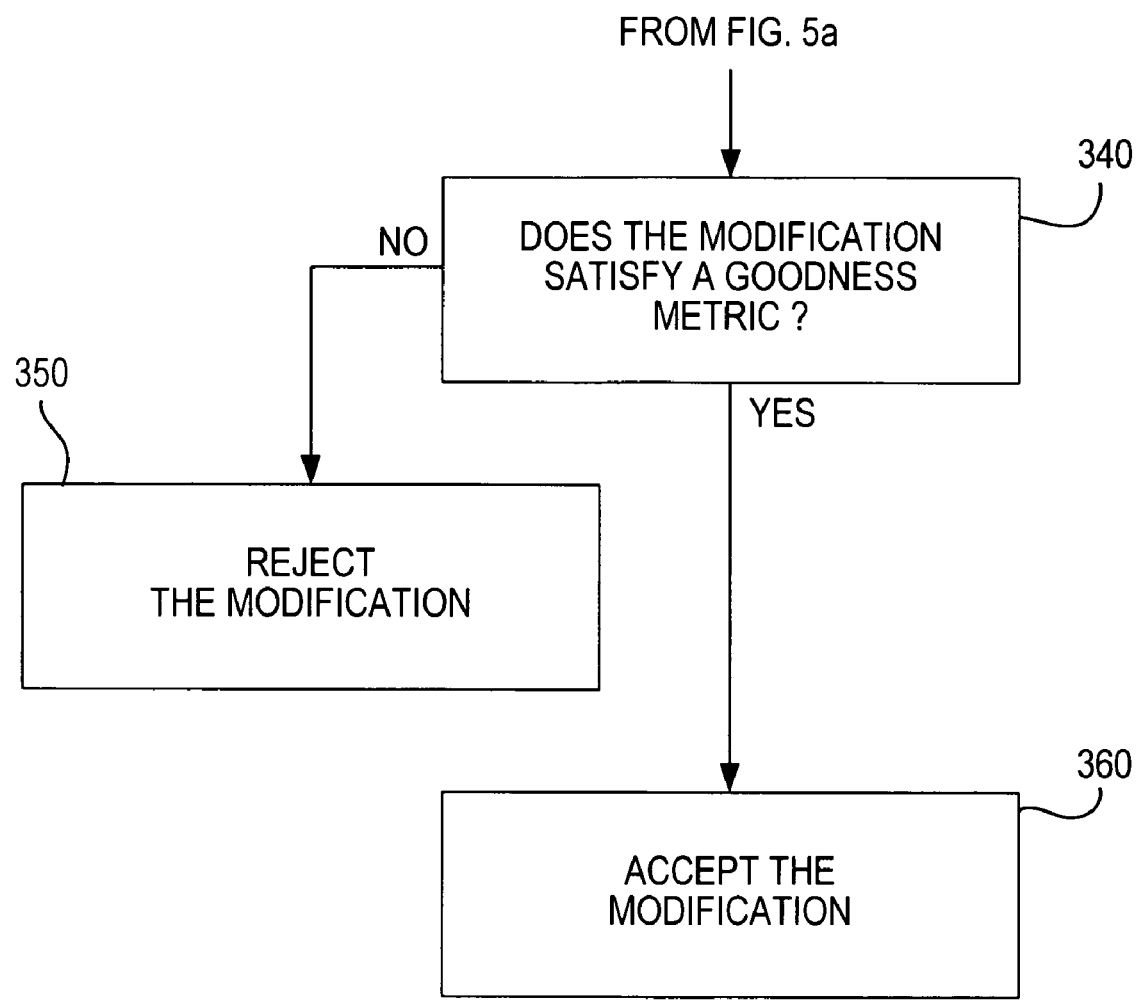

In accordance with an illustrative embodiment of the present invention, at the end of the structured ASIC synthesis step (e.g., after performance of step 250 for all LUTs), the flow shown in FIGS. 5a and 5b may be performed. In step 310 delays are computed for all of the combinational nodes in the structured ASIC design. This may be done in both the input direction and the output direction. In step 320 so-called critical nodes are identified. A node is said to appear on a critical path if the total delay is equal to the maximum delay of the design. A threshold is used to identify nodes that are not critical but that are close to critical. The delay model itself can be a combination of the node fanout and the number of HLE levels a given input has to go through. It will be appreciated that different inputs of a cell go through different numbers of HLE stages to reach the cell output, so they are assigned different delay values.

In step 330 a modification of the structured ASIC design may be attempted for each critical or near critical node. Examples of possible modifications are discussed later in this specification. (To simplify the further discussion, critical and near critical nodes will generally be referred to simply as critical nodes.)

In step 340 the effectiveness of each modification is tested to determine whether the modification should be accepted (step 360) or rejected (step 350). For example, in order to be accepted, the modification may be required to satisfy a "goodness" metric, which can be the amount by which the modification reduces the maximum delay of the design or a combination of the maximum delay and the average delay.

It will be appreciated that other strategies can be used to compute the delay and critical nodes. For example, a timing analysis algorithm can be called.

Figure 6A:
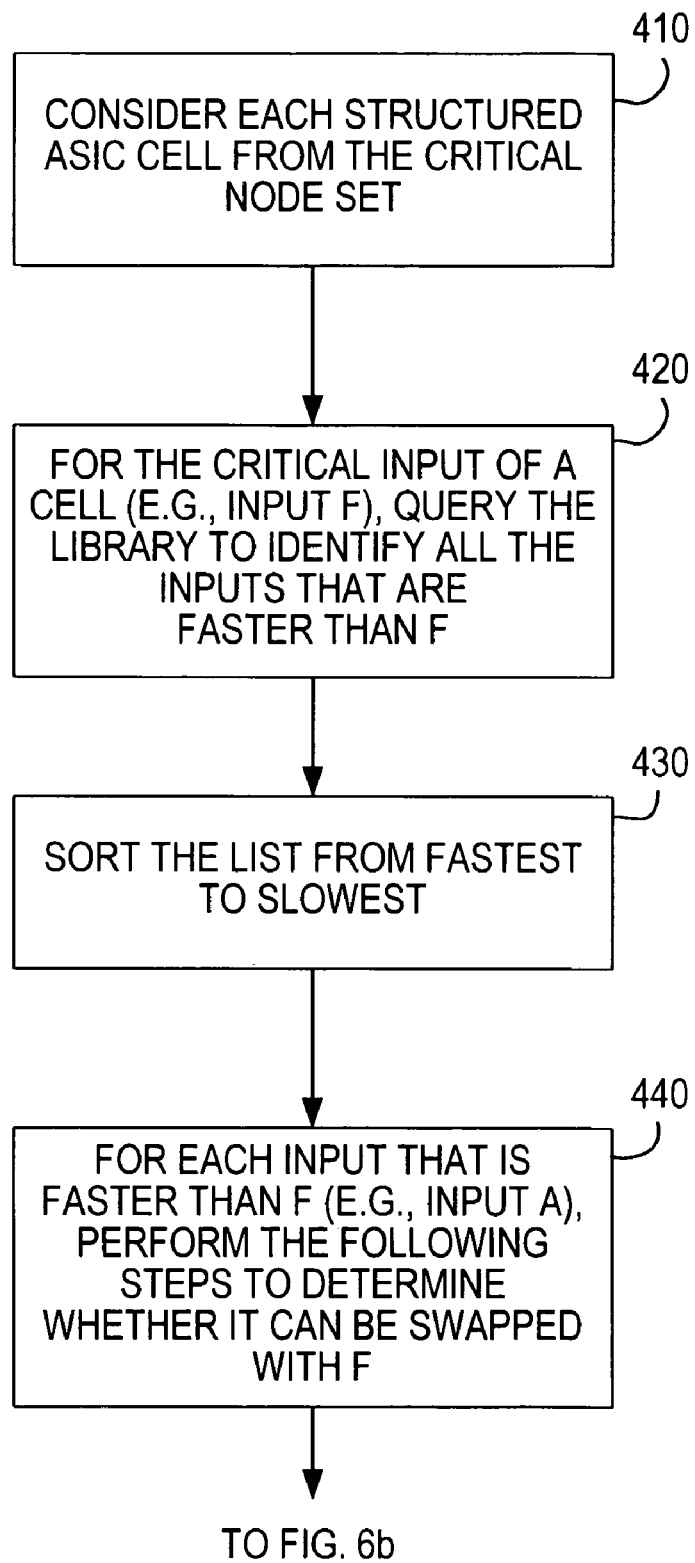
FIGS. 6a and 6b are collectively a simplified flow chart of an illustrative elaboration of one of the steps in FIG. 5b in accordance with the invention.
Figure 6B:
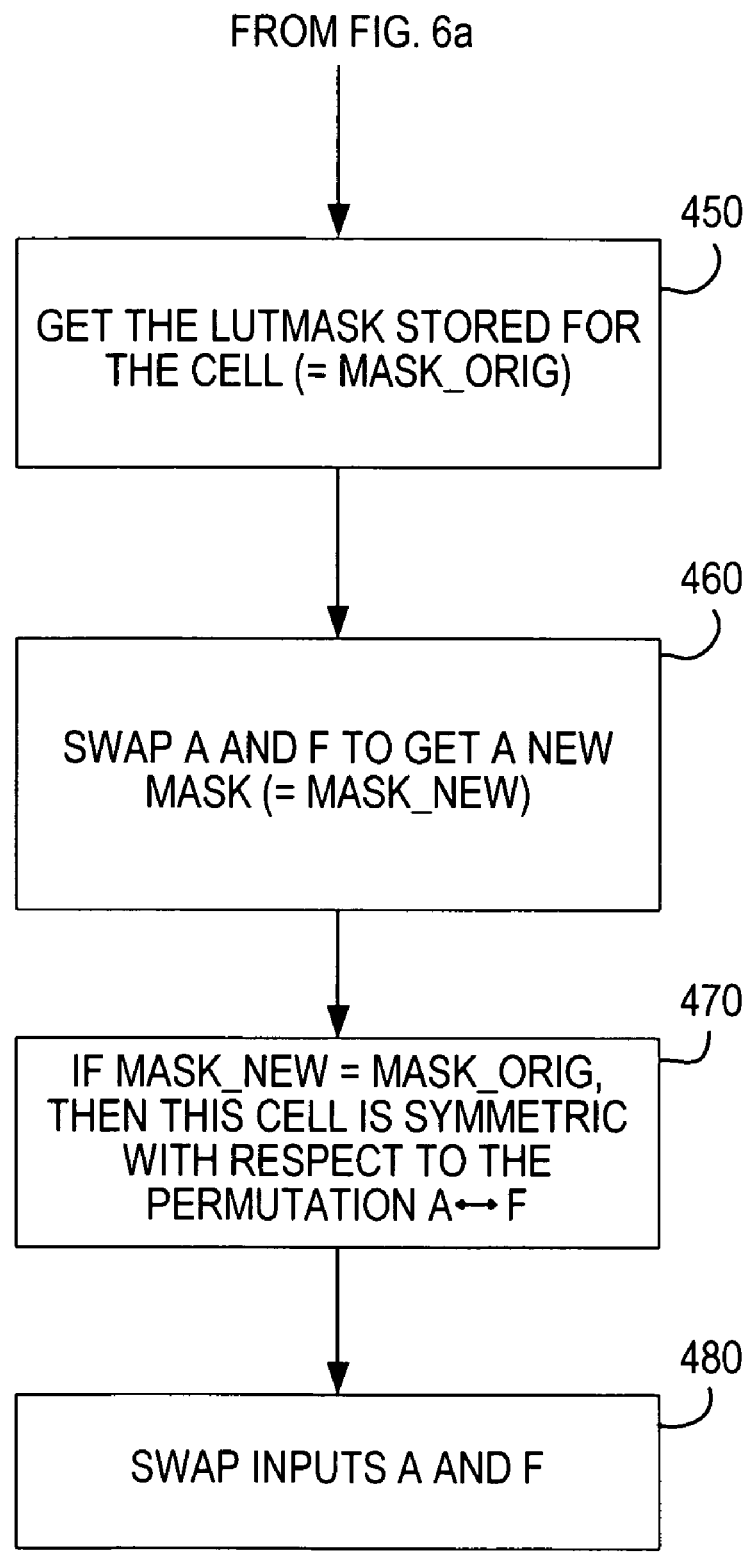

FIGS. 6a and 6b illustrate a type of modification that can be performed in relation to step 330 in accordance with the invention. This type of modification is a permutation of inputs to a structured ASIC cell.

In step 410 each structured ASIC cell from the critical node set (step 320) is considered.

In step 420, for the critical input of a cell from step 410 (e.g., input F), the structured ASIC cell library is queried to identify all of the physical inputs to that cell that are faster than physical input F.

In step 430, the faster physical inputs (assuming there are any) are sorted from fastest to slowest.

In step 440, for each physical input that is faster than F (preferably starting with the fastest (e.g., physical input A)), the steps described below are performed.

In step 450 the LUTMASK stored for the structured ASIC library cell being used is retrieved (e.g., from the structured ASIC cell library) and defined as MASK_ORIG.

In step 460 logical inputs A and F are swapped and the resulting new LUTMASK value for the cell is determined. This new value is defined as MASK_NEW.

In step 470, MASK_NEW and MASK_ORIG are compared. If they are equal, then the cell is symmetric with respect to logical inputs A and F. This means that these logical inputs can be swapped with no need to change the underlying structured ASIC cell. Accordingly, this swap is performed (i.e., original, critical, logical input F is routed to faster physical input A, and original logical input A is routed to slower physical input F. Steps 340 et seq. are then performed to determine whether or not the swap is sufficiently effective to warrant keeping it. If so, the swap is accepted and processing moves on to consider another possible modification (e.g., for another critical node). If the swap is not sufficiently effective to warrant accepting, another possible input swap may be tried for the structured ASIC cell being considered (if other, possibly effective swaps have been identified in step 420). These other possible swaps may be tried in order from fastest to slowest, as identified in step 430.

Figure 7A:
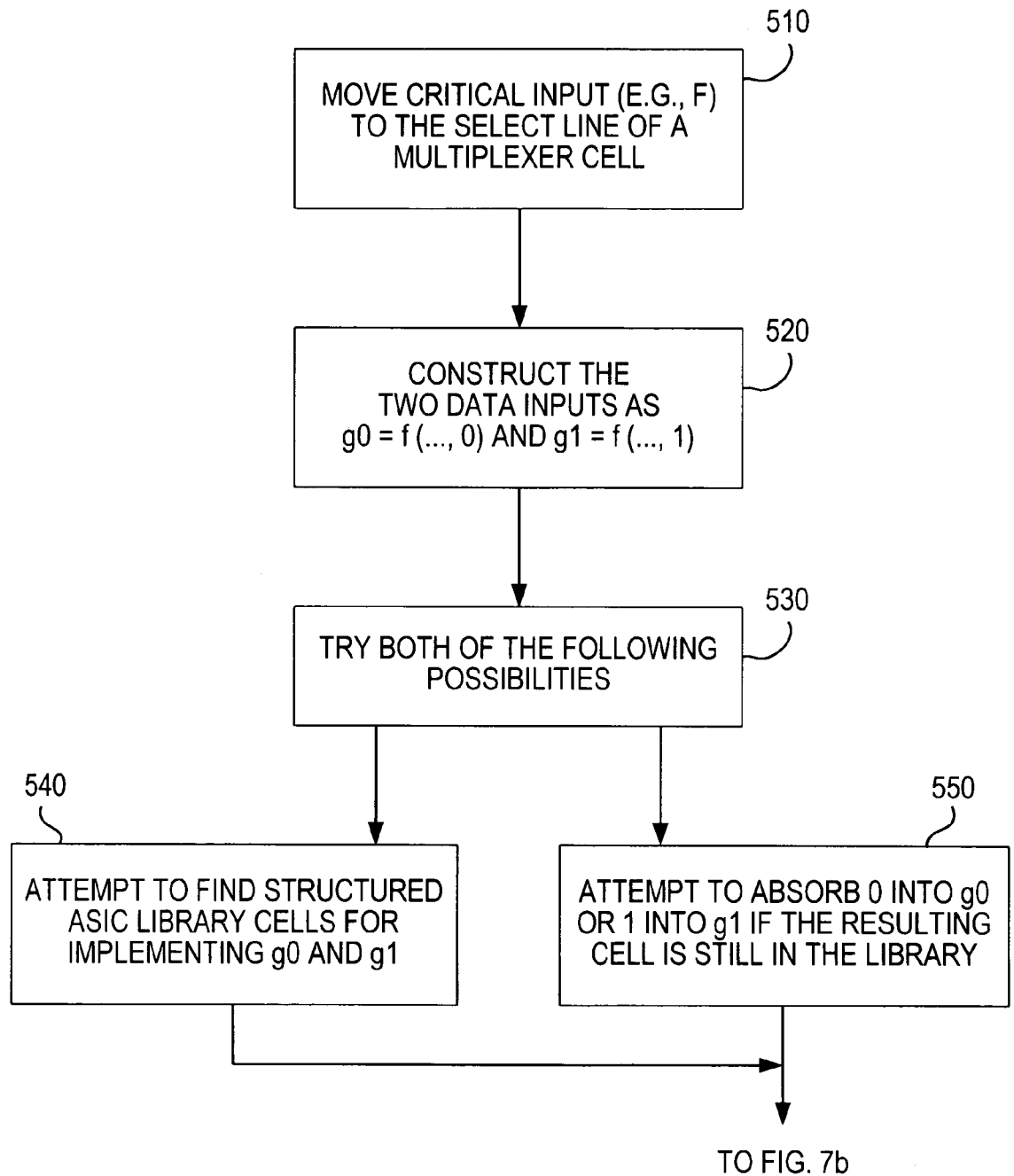
FIGS. 7a and 7b are collectively a simplified flow chart of an alternative or additional illustrative elaboration of one of the steps in FIG. 5b in accordance with the invention.
Figure 7B:
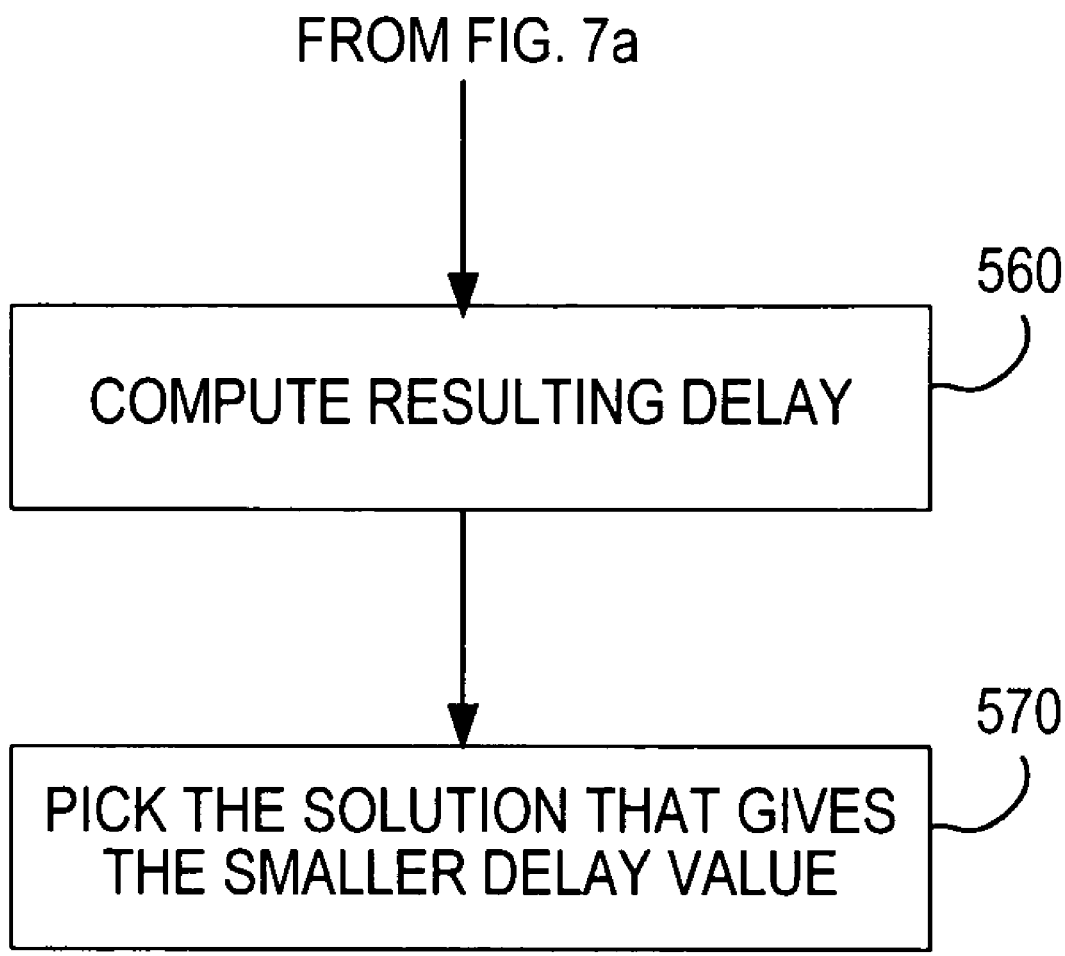
Figure 8:
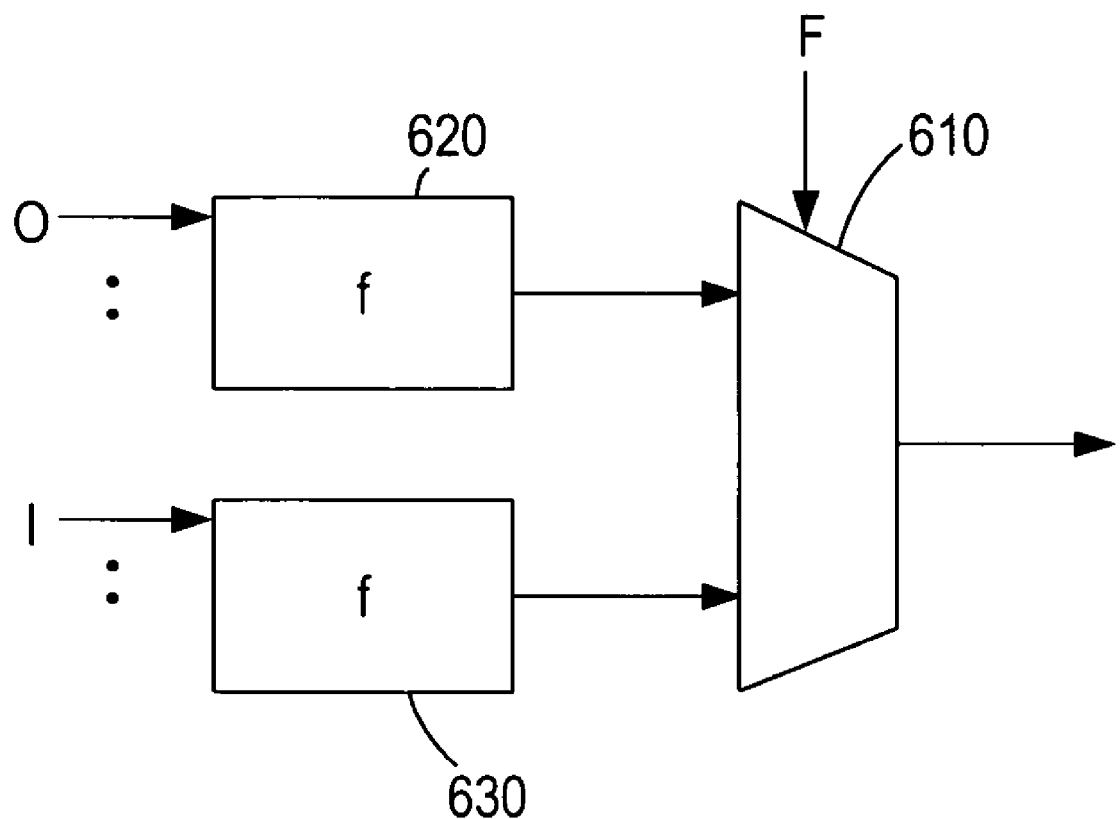
FIG. 8 is a simplified block diagram of illustrative structured ASIC circuitry in accordance with certain aspects of what is shown in FIGS. 7a and 7b.

FIGS. 7a and 7b illustrate another type of modification that can be performed in relation to step 330 in accordance with the invention. This type of modification uses Shannon's decomposition. In this approach, step 510 is performed to move the critical input F to the select line of a two-input multiplexer ("mux") cell 610 (FIG. 8) in the structured ASIC design being developed. In step 520 the two data inputs 620 and 630 are constructed as g0=f( . . . , 0) and g1=f( . . . , 1), respectively. (In a typical Altera Fusion-type product, the delay of the select line of a mux cell like 610 is 120 ps.) Step 530 then initiates trying both of the possibilities specified in steps 540 and 550.

In step 540 an attempt is made to find, in the structured ASIC cell library, cells for implementing g0 and g1. If that can be done, then those library cells can be used as components 620 and 630 in the modified implementation, shown in FIG. 8, of the starting structured ASIC cell.

In step 550 an attempt is made to absorb 0 into g0 or 1 into g1. This can be done if the resulting cell is still in the structured ASIC library. It will be appreciated that in an embodiment in which all four-input functions are library cells, if the original function f has five or fewer inputs, it is always possible to look at this alternative.

In step 560 the delays resulting from the step 540 and step 550 modifications are computed (assuming that there are usable results from steps 540 and/or 550). In step 570 the solution that gives the smaller value is picked (e.g., for further consideration in step 340).

It will be appreciated that modifications of the type illustrated by FIGS. 7a and 7b essentially turn one starting structured ASIC cell into three structured ASIC cells (610, 620, and 630) if the modification is ultimately accepted.

Figure 9:
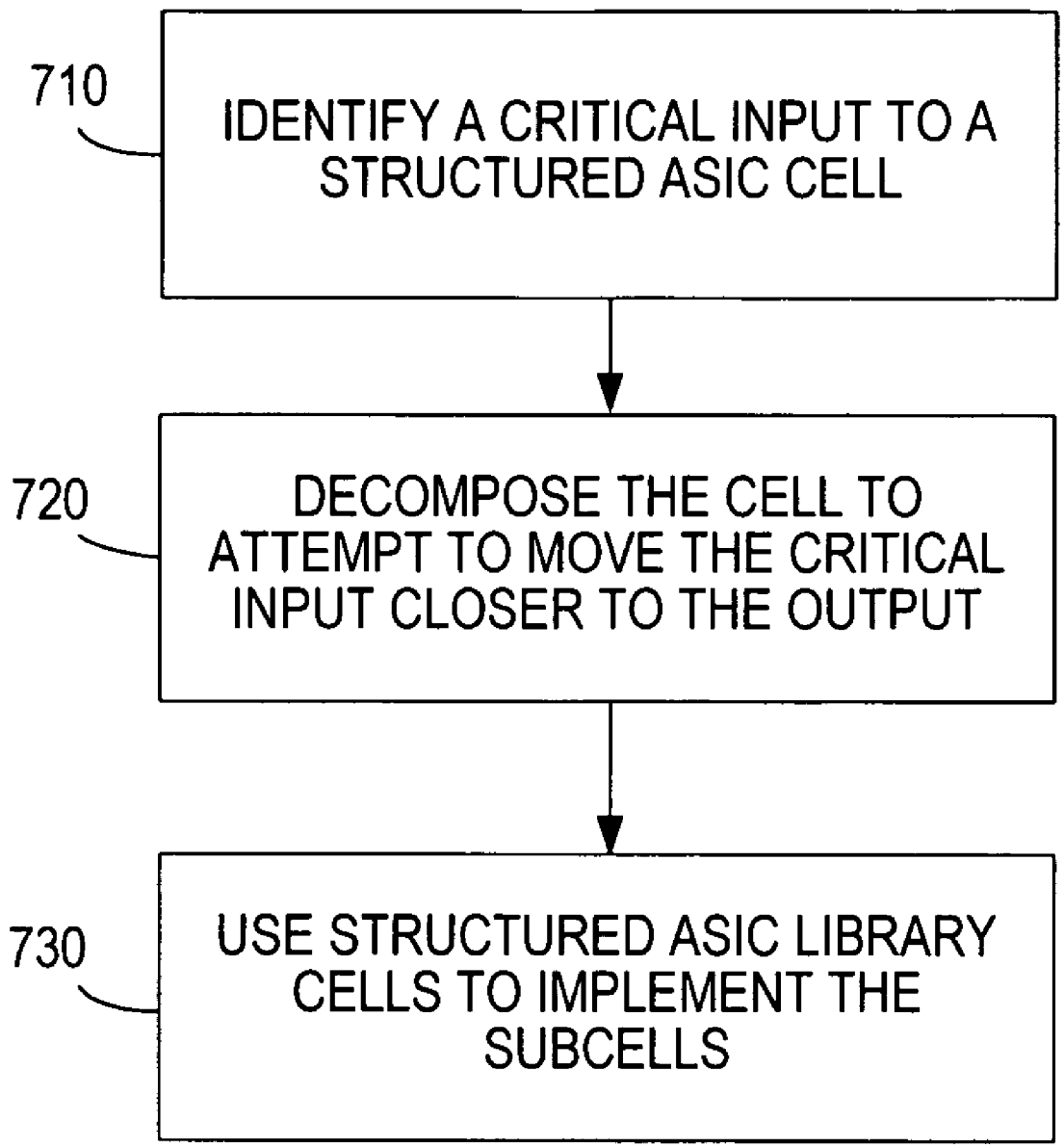
FIG. 9 is a simplified flow chart of another alternative or additional illustrative elaboration of one of the steps in FIG. 5b in accordance with the invention.

FIG. 9 illustrates another type of modification that can be attempted in relation to step 330 in accordance with the invention. This is decomposition of a starting structured ASIC cell having a critical input in order to move that critical input closer to the output. For example, a cell whose LUTMASK is 6AFFFF6AFF6AFF6A has a typical A input delay (in an Altera Fusion-type product) of 477 ps. Its functionality is as follows:

$$f=A\&(D\$(E\&F)+C'+B')+A'\&(B\&C+D\$(E\&F))$$

(& denotes AND, + denotes OR, and $ denotes XOR). If we define X=D $ (E & F) and Y=B & C, then f can be decomposed as $$f=A\&(X+Y)+A'\&(X+Y)=X+A\$Y$$

Figure 10:
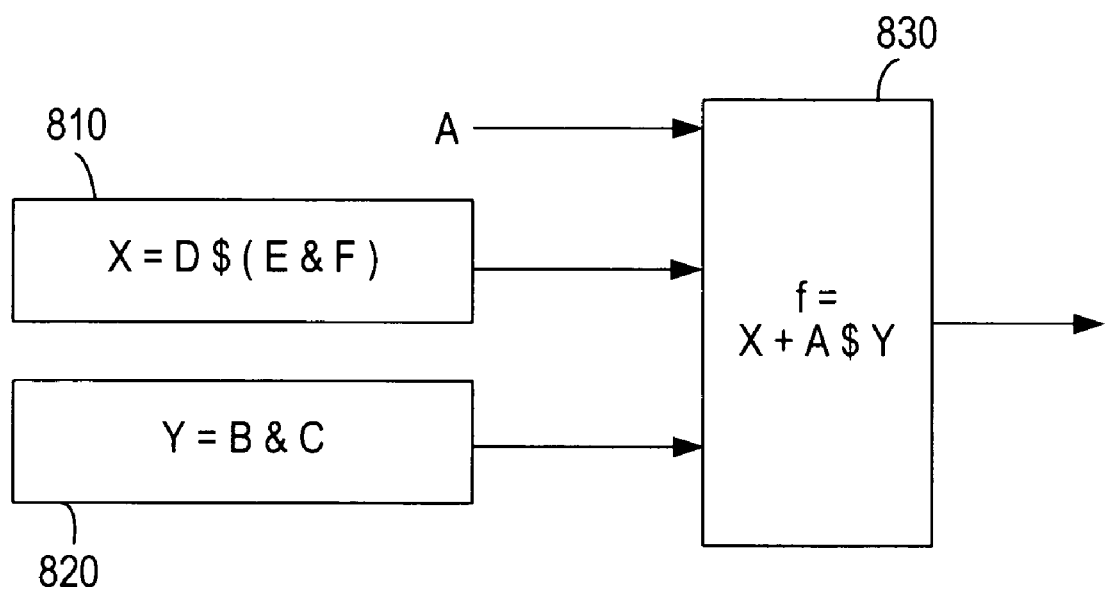
FIG. 10 is a simplified block diagram of illustrative structured ASIC circuitry in accordance with certain aspects of what is shown in FIG. 9.

FIG. 10 shows a structured ASIC implementation in these terms. Three structured ASIC library cells ("subcells") 810, 820, and 830 replace the original structured ASIC cell. The delay from input A to the cell output is now reduced to 220 ps in an Altera Fusion-type product.

Returning to FIG. 9, in step 710 a critical input (e.g., A in the above example) to a structured ASIC cell is identified.

In step 720 the cell is decomposed to move the initial input closer to the output, if possible.

In step 730 an attempt is made to find each subcell in the decomposition in the library of structured ASIC cells. If that can be done, those library cells are used to produce (as in FIG. 10) a modified structured ASIC implementation of the starting ASIC library cell. Step 340 can then be performed as part of a determination as to whether or not to retain this modification in the final structured ASIC design.

Figure 11:
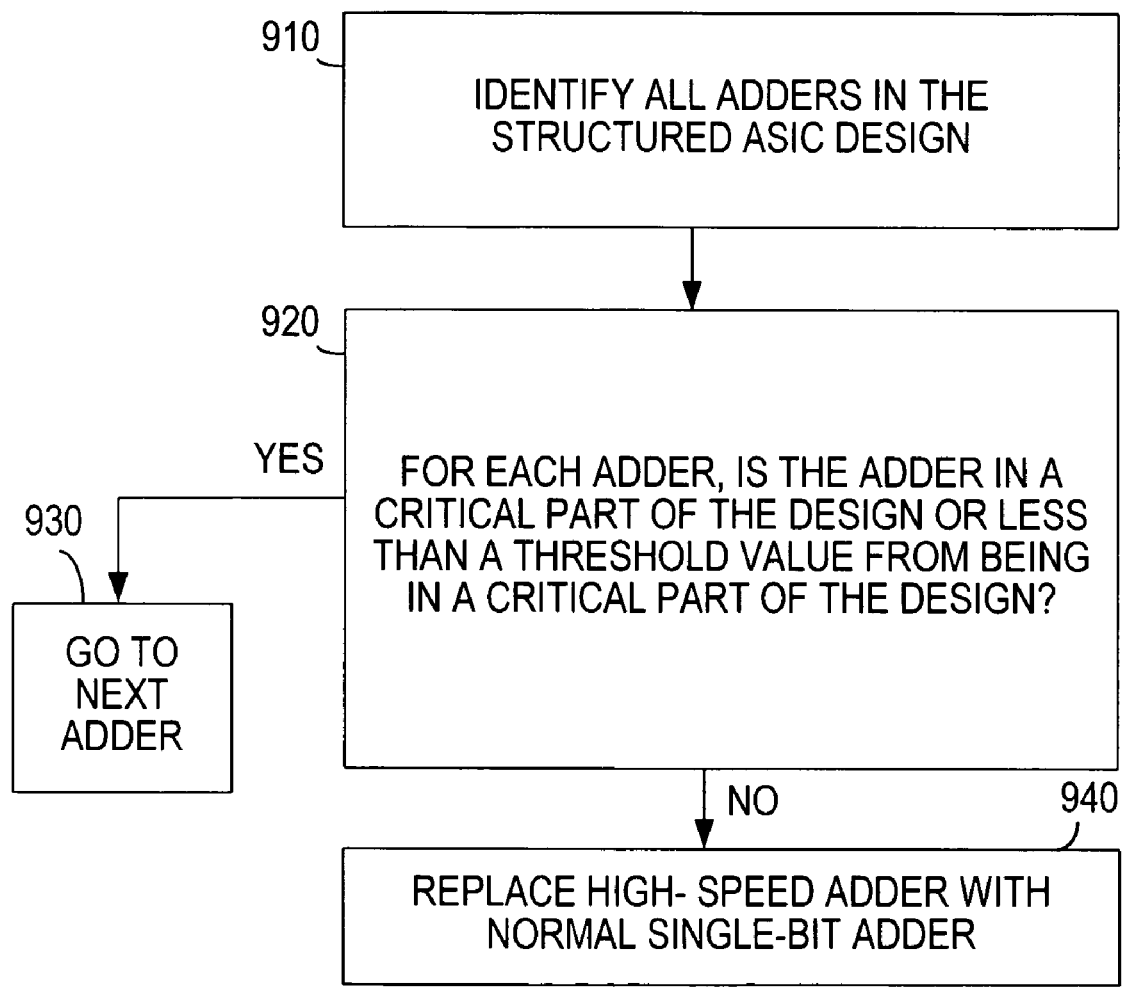
FIG. 11 is a simplified flow chart illustrating another possible aspect of the invention.

FIG. 11 illustrates another type of modification that can be employed in accordance with the invention. In step 910 all adders in the structured ASIC design are identified.

In step 920 each adder is tested to determine whether it is in a critical or near-critical part of the structured ASIC design. The threshold value mentioned in step 920 is used to establish what is near critical. If an adder is critical or near-critical, step 930 is performed to leave the default, high-speed, two-bit adder implementation (e.g., as in FIG. 2a) in place in the structured ASIC design. On the other hand, if an adder is not critical or near-critical, step 940 is performed.

Figure 2B:
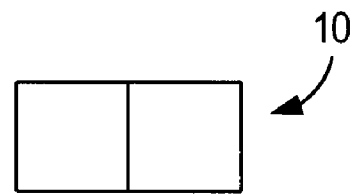
FIG. 2b is a simplified block diagram of other illustrative circuitry in a structured ASIC device.

In step 940, the default, high-speed, two-bit adder is replaced by a normal single-bit adder (e.g., as in FIG. 2b).

Modifications of the type covered by FIG. 11 help save HLE usage and power consumption by the final structured ASIC design.

Figure 12:
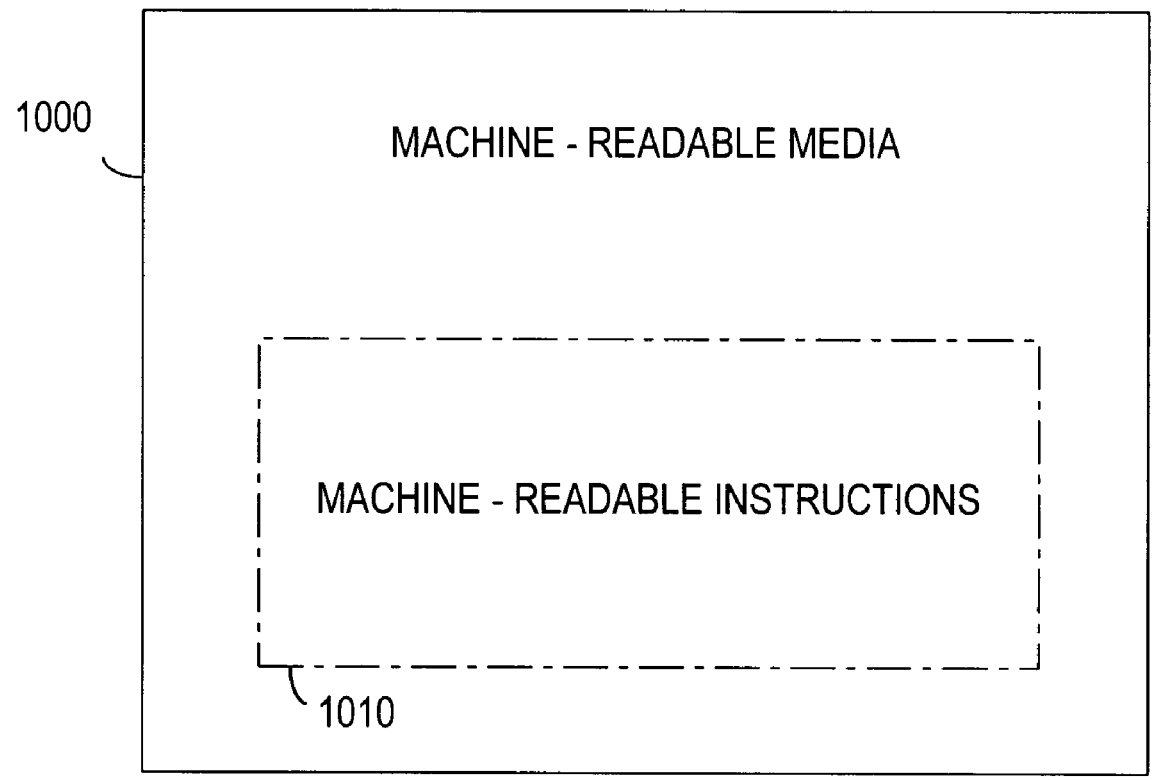
FIG. 12 is a simplified block diagram of illustrative machine-readable media in accordance with a possible aspect of the invention.

FIG. 12 illustrates another possible aspect of the invention. This is machine-readable media 1000 (e.g., magnetic disc(s), optical disc(s), magnetic tape(s), or the like) encoded with machine-readable instructions 1010 (e.g., a computer program) for at least partly performing one or more methods in accordance with the invention.

It will be understood that the foregoing is only illustrative of the principles of the invention, and that various modifications can be made by those skilled in the art without departing from the scope and spirit of the invention. For example, the order in which certain steps are performed can, in some cases, be different from the order shown and described herein.

The invention claimed is:

1. A method of designing a structured ASIC to be functionally equivalent to a programmed FPGA comprising:
    producing a design for the programmed FPGA, said programmed FPGA design including a plurality of programmed look-up tables;
    converting the design to a structured ASIC design by using a respective, functionally equivalent, structured ASIC library cell for each of said programmed look-up tables;
    identifying a critical path in the structured ASIC design;
    for an input to a cell in the critical path, which input affects an output of said cell that is also in the critical path, searching for a physical input of the cell that is faster to affect said output of said cell than an initial physical input assignment of that input; and
    when a faster physical input is found, then transferring the input from the initial physical input assignment to the faster physical input when the transferring can be done without loss of functional equivalence between the cell and the programmed look-up table that was converted to the cell in the converting.

2. The method defined in claim 1 wherein the transferring comprises:
   determining whether the cell is functionally symmetric with respect to the initial physical input assignment and the faster physical input.

3. The method defined in claim 2 wherein the transferring further comprises:
   swapping the inputs initially assigned to the initial physical input assignment and the faster physical input if the cell is determined to be functionally symmetric with respect to those inputs.

4. The method defined in claim 3 further comprising:
   determining whether the structured ASIC design after the swapping has improved performance as compared to the structured ASIC design before the swapping.

5. The method defined in claim 4 further comprising:
   retaining the swapping only if the structured ASIC design after the swapping is determined to have better performance than the structured ASIC design before the swapping.

6. Machine-readable media embodied as a physical storage medium encoded with machine-readable instructions for performing the method defined in claim 1.

7. A method of designing a structured ASIC to be functionally equivalent to a programmed FPGA comprising:
   producing a design for the programmed FPGA, said programmed FPGA design including a plurality of programmed look-up tables;
   converting the design to a structured ASIC design by using a respective, functionally equivalent, structured ASIC library cell for each of said programmed look-up tables;
   identifying a critical path in the structured ASIC design; and
   for an input to a cell in the critical path, which input affects an output of said cell that is also in the critical path, applying, Shannon's decomposition to that cell, including using the input as a selection control signal for a multiplexer at the output of the Shannon's decomposition of the cell, wherein the applying comprises:
   constructing subcells for supplying signals to data inputs of the multiplexer such that the subcells and the multiplexer are collectively functionally equivalent to the cell; and
   locating, in a library of structured ASIC cells that are functionally equivalent to programmed FPGA look-up table functions, structured ASIC cells that can be used to implement the subcells in the structured ASIC design.

8. The method defined in claim 7 further comprising:
   determining whether the structured ASIC design after the Shannon's decomposition has improved performance as compared to the structured ASIC design before the Shannon's decomposition.

9. The method defined in claim 8 further comprising:
   retaining the Shannon's decomposition only if the structured ASIC design after that decomposition is determined to have better performance than the structured ASIC design before that decomposition.

10. Machine-readable media embodied as a physical storage medium encoded with machine-readable instructions for performing the method defined in claim 7.

11. A method of designing a structured ASIC to be functionally equivalent to a programmed FPGA comprising:
    producing a design for the programmed FPGA;
    converting the design to a structured ASIC design;
    identifying a critical path in the structured ASIC design; and
    for an input to a cell in the critical path, decomposing the cell in such a way that the input can be moved closer to the output in the decomposition of the cell.

12. The method defined in claim 11 wherein the decomposing comprises:
    constructing subcells that are collectively functionally equivalent to the cell, the subcells including a downstream cell and an upstream cell, an output of the upstream cell and the input being inputs to the downstream cell.

13. The method defined in claim 12 further comprising:
    locating, in a library of structured ASIC cells that are functionally equivalent to programmed FPGA functions, structured ASIC cells that can be used to implement the subcells in the structured ASIC design.

14. The method defined in claim 13 further comprising:
    determining whether the structured ASIC design after the decomposition has improved performance as compared to the structured ASIC design before the decomposition.

15. The method defined in claim 14 further comprising:
    retaining the decomposition only if the structured ASIC design after that decomposition is determined to have better performance than the structured ASIC design before that decomposition.

16. Machine-readable media embodied as a physical storage medium encoded with machine-readable instructions for performing the method defined in claim 11.

17. A method of designing a structured ASIC to be functionally equivalent to a programmed FPGA comprising:
    producing a design for the programmed FPGA;
    converting the design to a structured ASIC design;
    identifying a non-critical part of the structured ASIC design;
    identifying a high-speed adder in the non-critical part of the design; and
    converting the high-speed adder to a slower-speed adder.

18. The method defined in claim 17 wherein the high-speed adder comprises a two-bit adder.

19. The method defined in claim 17 wherein the slower-speed adder comprises a one-bit adder.

20. Machine-readable media embodied as a physical storage medium encoded with machine-readable instructions for performing the method defined in claim 17.

* * * * *